(12) United States Patent
Yasunaga et al.

(10) Patent No.: US 6,700,186 B2
(45) Date of Patent: Mar. 2, 2004

(54) LEAD FRAME FOR A SEMICONDUCTOR DEVICE, A SEMICONDUCTOR DEVICE MADE FROM THE LEAD FRAME, AND A METHOD OF MAKING A SEMICONDUCTOR DEVICE

(75) Inventors: Shoshi Yasunaga, Fukuoka (JP); Hideshi Hanada, Fukuoka (JP); Takahiro Ishibashi, Fukuoka (JP); Jun Sugimoto, Fukuoka (JP); Yuichi Dohki, Fukuoka (JP); Hitoshi Etoh, Fukuoka (JP)

(73) Assignee: Mitsui High-tec, Inc. (JP)

( * ) Notice: Subject to any disclaimer, the term of this patent is extended or adjusted under 35 U.S.C. 154(b) by 0 days.

(21) Appl. No.: 10/024,827

(22) Filed: Dec. 17, 2001

(65) Prior Publication Data

US 2002/0079561 A1 Jun. 27, 2002

(30) Foreign Application Priority Data

Dec. 21, 2000 (JP) .................................. P.2000-388711

(51) Int. Cl.[7] ............................................. H01L 23/495
(52) U.S. Cl. ................... 257/672; 257/674; 257/675; 257/676; 257/670; 257/666; 257/796; 257/692; 438/106; 438/123
(58) Field of Search ....................... 257/672, 674–676, 257/670, 666, 796, 792; 438/106, 123

(56) References Cited

U.S. PATENT DOCUMENTS 5,378,656 A * 1/1995 Kajihara et al. ............... 29/827
6,448,107 B1 * 9/2002 Hong et al. .................. 438/106
6,483,180 B1 * 11/2002 Bayan et al. ................ 257/684

* cited by examiner

*Primary Examiner*—Evan Pert
*Assistant Examiner*—Luan Thai
(74) *Attorney, Agent, or Firm*—Wood, Phillips, Katz, Clark & Mortimer

(57) ABSTRACT

A lead frame for a semiconductor device. The semiconductor device has a sheet with oppositely facing sides and a thickness between the oppositely facing sides. The sheet has first and second unit lead frames. Each unit lead frame has a support for a semiconductor chip and at least one lead space from the support. The sheet has a tie bar network which connects a) the support to the at least one lead on each of the first and second lead frames and b) the first and second lead frames, each to the other. The sheet has a dividing line along which the sheet can be cut to separate the first and second lead frames from each other. The tie bar network consists of at least one tie bar extending along a substantial length of the dividing line. The support has a first thickness between the oppositely facing sides of the sheet. The at least one tie bar has a second thickness between the oppositely facing sides of the sheet over a substantial length of the dividing line that is less than the first thickness.

43 Claims, 11 Drawing Sheets

LEAD FRAME FOR A SEMICONDUCTOR DEVICE, A SEMICONDUCTOR DEVICE MADE FROM THE LEAD FRAME, AND A METHOD OF MAKING A SEMICONDUCTOR DEVICE

BACKGROUND OF THE INVENTION

1. Field of the Invention

This invention relates to semiconductor devices each incorporating a unit lead frame made as by performing a mold array process (MAP). The invention is also directed to a method of making a semiconductor device.

2. Background Art

It is known to make semiconductor devices by bonding semiconductor chips to a lead frame and applying a sealing resin over the chip at one side of the unit lead frame. In recent years, the desire to miniaturize, and provide higher density, semiconductor devices has caused the proliferation of, among other semiconductor devices, those known as SON (small outline non-leaded package) and QFN (quad flat non-leaded package) semiconductor devices.

Figure 21:
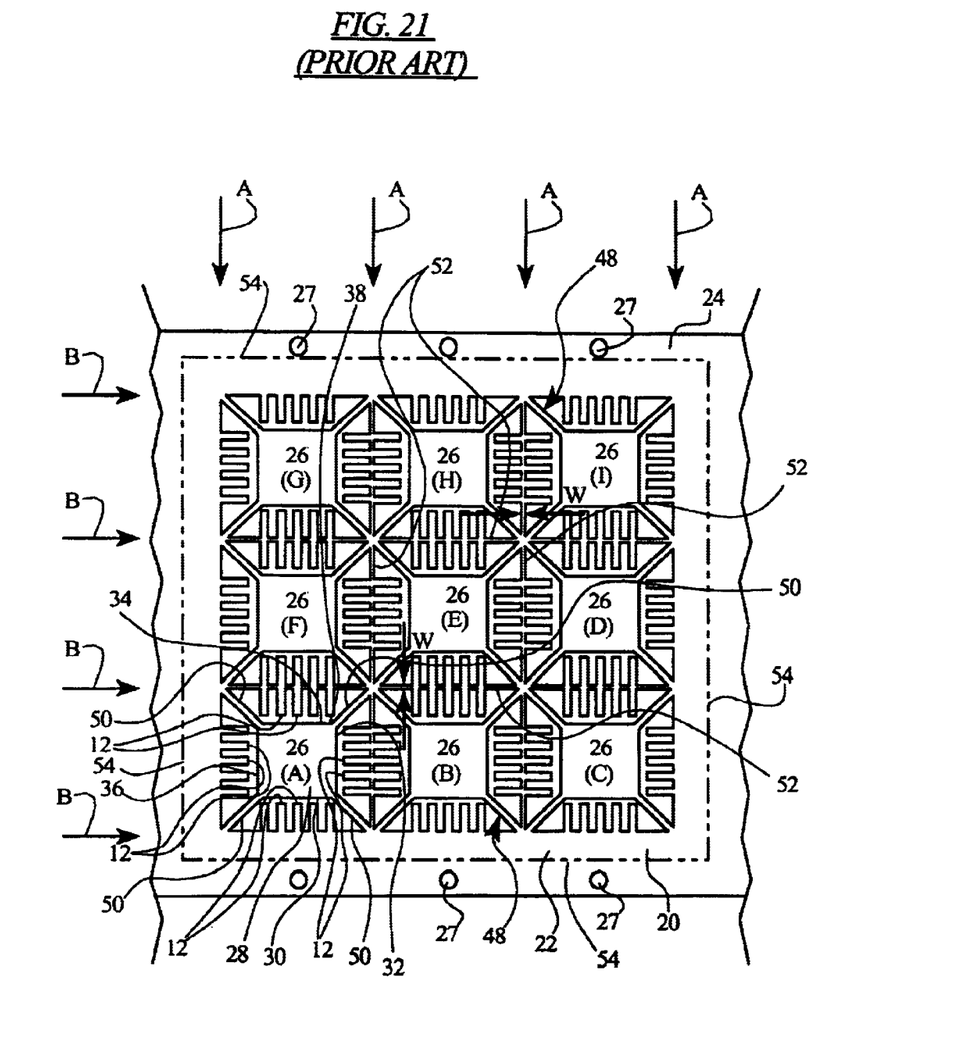
FIG. 21 is a fragmentary, plan view of a conventional lead frame usable to make a plurality of semiconductor devices.
Figure 22:
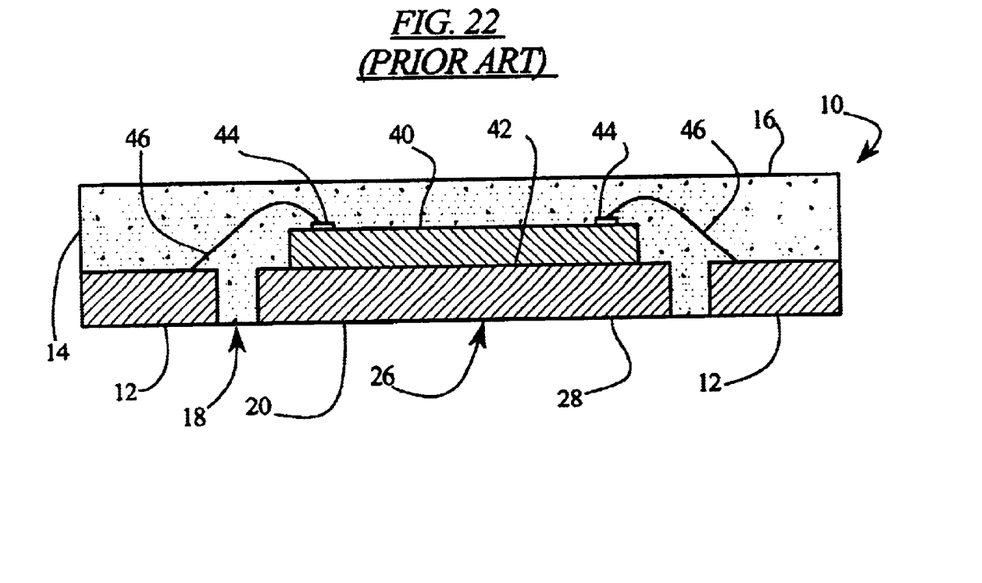
FIG. 22 is an enlarged, cross-sectional view of a conventional semiconductor device.
Figure 23:
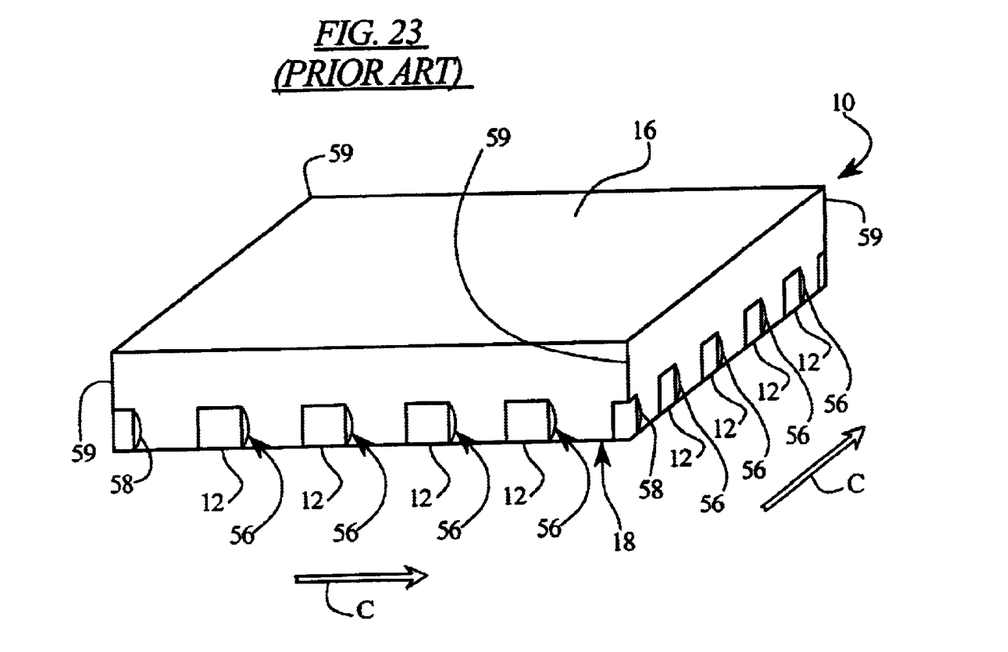
FIG. 23 is an enlarged, perspective of the semiconductor device in FIG. 22.

Reference is made to FIGS. 21–23 herein wherein this type of semiconductor device is shown at 10. The semiconductor device 10 has leads 12 which do not project at a peripheral edge 14 of the semiconductor device 10 beyond a resin layer 16. The leads 12 are exposed in this design at a back side 18 of the semiconductor device 10.

It is known to manufacture semiconductor devices with substrates made from PCB, tape, and the like, practicing a manufacturing method known as a MAP process (mold array process). With this process, a sheet 20 is conventionally formed into a lead frame 22 with a base rail 24 connected to and surrounding a matrix of unit lead frames 26, identified as A–I. Drive openings 27 facilitate manipulation of the base rail 24. As described in greater detail below, the components of the semiconductor device 10 are built up upon the lead frame 22, which is ultimately cut to separate the individual semiconductor devices 10 (in this case nine (9) in number) from each other and the base rail 24. This process has been practiced to make the aforementioned SON and QFN semiconductor devices, as well as other types of semiconductor devices.

More particularly, in carrying out the MAP process to produce the semiconductor devices 10, the lead frame 22 is formed as shown in FIG. 21. Each unit lead frame 26 has a similar construction and, as shown for exemplary lead frame 26 at A, consists of a rectangular support 28 with four leads 12 at each of four outer edge portions 30, 32, 34, 36 cooperatively defining the peripheral outer edge 38 of the support 28. A semiconductor chip 40 is bonded to the support 28 using an adhesive or an adhesive tape 42. Electrodes 44 on the semiconductor chip 40 are electrically connected to the leads 12 through conductive wires 46.

The supports 28, leads 12, and base rail 24 are maintained in a desired relative position by a tie bar network 48. The tie bar network 48 consists of a plurality of elongate tie bars, including support tie bars 50, projecting in a diagonal direction each from a corner of the support, and peripheral tie bars 52 (numbered for the unit lead frame 26 at E), which extend around the perimeter of the individual unit lead frames 26 and interconnect with each other, the leads 12, the support tie bars 50, and the base rail 24.

Once the semiconductor chips 40 are applied and electrically connected to the leads 12, the resin layer 16 is applied in sealing fashion. The resin layer 16 is applied so as to simultaneously seal all of the unit lead frames 26 (A–I) continuously over the matrix of unit lead frames 26 within the square line 54.

The individual semiconductor device 10 are separated and completed by strategically cutting a lead frame assembly, consisting of the lead frame 22 with the semiconductor chips 40, conductive wires 46, and resin layer 16 thereon, along lines indicated by the arrows A, and lines orthogonal thereto, as indicated by the arrows B. This effects separation of the semiconductor devices 10 from each other and the base rail 24. This cutting may be effected using a saw with a width at least as large as the width W of the peripheral tie bars 52.

The MAP process is desirable from the standpoint that the resin application can be carried out simultaneously for all of the semiconductor devices 10. A single die can be used to facilitate the resin application. This process lends itself to being carried out efficiently and economically.

However, the MAP process described above, using the conventional structure shown in FIGS. 21–23, has a number of inherent problems. One problem results from the difference in the hardness of the material defining the lead frame 22 and the resin layer 16. As the cutting blade cuts through the lead frame assembly, the resistance to cutting is different by reason of the different hardness of the two materials. As a result of this, there may be different deformation resulting from the cutting operation at different locations around the periphery of the semiconductor device 10. This condition may cause a separation between the resin layer 16 and parts of the lead frame 22 at their interface. As just one example, this separation phenomenon is shown at 56 in FIG. 23 where the resin layer 16 and lead frame 22 are bonded prior to performance of the cutting operation. Generally, this condition occurs in a downstream direction on a part of the lead frame 22 with respect to the cutting direction, as indicated by the arrows C in FIG. 23.

An additional problem is that the cutting may form burrs 58 at the corners 59 to which the support tie bars 50 project. These burrs 58 likewise tend to form on the four tie bars 50 in a downstream region with respect to the cutting direction, as indicated by the arrow C. These burrs 58 not only affect the appearance and dimensions of the semiconductor devices 10, but may also compromise the quality of an electrical connection to the semiconductor device 10. To alleviate this problem, a separate deburring step may be required. This potentially complicates the manufacturing process and increases attendant costs.

SUMMARY OF THE INVENTION

In one form, the invention is directed to a lead frame for a semiconductor device. The semiconductor device has a sheet with oppositely facing sides and a thickness between the oppositely facing sides. The sheet has first and second unit lead frames. Each unit lead frame has a support for a semiconductor chip and at least one lead space from the support. The sheet has a tie bar network which connects a) the support to the at least one lead on each of the first and second lead frames and b) the first and second lead frames, each to the other. The sheet has a dividing line along which the sheet can be cut to separate the first and second lead frames from each other. The tie bar network consists of at least one tie bar extending along a substantial length of the dividing line. The support has a first thickness between the oppositely facing sides of the sheet. The at least one tie bar has a second thickness between the oppositely facing sides of the sheet over a substantial length of the dividing line that is less than the first thickness.

In one form, the base on the first unit lead frame has a polygonal shape with an outer edge defined by a plurality of straight edge portions. The dividing line is substantially straight and has a length and is spaced from, and extends substantially parallel to, one of the straight edge portions. The at least one tie bar has a thickness between the oppositely facing sides of the sheet that is less than the first thickness over substantially the entire length of the dividing line.

In one form, the first unit lead frame has a corner and the tie bar network consists of a support tie bar assembly including at least one support tie bar that extends from the support on the first unit lead frame towards the corner.

The second difference in the lead frame 142 is at the leads 66'. Each lead 66' is formed with an undercut 160 along a substantial length thereof, which undercut resides fully within, and is spaced from, side edges bounding the width of the lead 66'.

In one form, the support tie bar assembly has a length and a thickness between the oppositely facing sides of the sheet that is less than the first thickness over at least a portion of the length of the support tie bar assembly.

The at least one support tie bar may have a discrete opening therethrough.

In one form, the discrete opening is fully surrounded by the at least one support tie bar.

The discrete opening may be an elongate opening.

At least one lead on at least one of the unit lead frames may have an undercut formed therein.

In one form, the first and second unit lead frames each have a rectangular shape with a peripheral edge defined by first, second, third, and fourth peripheral edge portions. The support on the first unit lead frame has a rectangular shape defined by first, second, third, and fourth outer edges. The first, second, third and fourth peripheral edge portions are substantially parallel to the first, second, third and fourth outer edges. There are a plurality of leads between the first peripheral edge portion and the first outer edge, the second peripheral edge portion and the second outer edge, the third peripheral edge portion and the third outer edge, and the fourth peripheral edge portion and the fourth outer edge.

In one form, the sheet has of a border rail and the tie bar network connects the first unit lead frame to the border rail. The first unit lead frame has a peripheral edge connected to the border rail through the tie bar network.

The sheet may have a second dividing line along the peripheral edge along which the sheet can be cut to separate the first unit lead frame from at least a part of the border rail. The tie bar network may have at least a second tie bar extending along a substantial length of the second dividing line. The at least second tie bar has a thickness between the oppositely facing sides of the sheet over a substantial length of the second dividing line that is less than the first thickness.

In one form, the support on the first unit lead frame is on a first side of the second dividing line and the at least part of the border rail is on a second side of the second dividing line. The at least one lead on the first unit lead frame and tie bar network are sufficiently symmetrical at the first and second sides of the second dividing line that resistance to cutting along the second dividing line at the first and second sides is substantially the same.

In one form, the support tie bar assembly extends to the corner at which the first and second peripheral tie bars meet and the sheet at the corner at which the first and second peripheral tie bars meet has a thickness that is less than the first thickness.

In one form, at least one of the oppositely facing sides of the sheet is formed to produce the second thickness.

The at least one of the oppositely facing sides may be formed by one of etching and compression.

In one form, the first unit lead frame has a peripheral edge defined by a plurality of peripheral edge portions. The tie bar network and the at least one lead extend continuously around the first unit lead frame so as to connect the first unit lead frame to a) the second unit lead frame, b) the border rail, and c) at least a third unit lead frame. At least a portion of the tie bar network has a thickness less than the first thickness extending substantially fully around the peripheral edge of the first unit lead frame.

In one form, the at least one lead has a portion with a thickness that is less than the first thickness.

In one form, the tie bar network has a thickness less than the first thickness extending continuously fully around the first unit lead frame.

The invention is also directed to a semiconductor assembly consisting of a lead frame, as previously described, a first semiconductor chip applied to the support on the first unit lead frame, a first conductive element electrically connecting the first semiconductor chip to the at least one lead on the first unit lead frame, a second semiconductor chip applied to the support on the second unit lead frame, a second conductive element electrically connecting the second semiconductor chip to the at least one lead on the second unit lead frame, and a resin layer applied over one of the oppositely facing sides of the sheet so as to be applied to the first and second semiconductor chips and the first and second conductive elements.

The invention is also directed to a method of forming a semiconductor device including the steps of: providing a semiconductor assembly as described above, and forming a first semiconductor device by cutting through the resin layer and the lead frame around the first unit lead frame including along the dividing line.

The invention is further directed to a semiconductor device consisting of a sheet portion defining a unit lead frame with oppositely facing sides and a thickness between the oppositely facing sides of the sheet portion. The unit lead frame has a support with a first thickness between the oppositely facing sides of the sheet portion. The unit lead frame has at least one lead and a tie bar network made up of a plurality of elongate tie bars, each with a length. The tie bar network connects the support to the at least one lead. A semiconductor chip is provided on the support. A conductive element electrically connects the semiconductor chip to the at least one lead. A resin layer is applied over the semiconductor chip, the conductive element, and at least a part of one of the oppositely facing sides of the sheet portion. The semiconductor device has a peripheral edge made up of a plurality of straight edge portions defining a polygonal shape. A plurality of the peripheral edge portions are formed by cutting to expose a part of the tie bar network. A first plurality of the elongate tie bars each have a substantial length that has a thickness between the oppositely facing sides of the sheet that is less than the first thickness.

DETAILED DESCRIPTION OF THE DRAWINGS

Referring initially to FIGS. 1–4 and 9–11, one form of semiconductor device, according to the present invention, is shown at 60. The semiconductor device 60 incorporates a unit lead frame 62 that is initially part of a lead frame 64 on which a matrix of like unit lead frames 62, identified as A–I, are formed. The semiconductor device 60, made from the unit lead frame 62 at A, has a polygonal/rectangular shape and is the type characterized as an SON (small outline non-leaded package) or QFN (quad flat non-leaded package) semiconductor device, as previously described, and wherein leads 66 thereon are exposed on a backside 68 of the semiconductor device 60.

Figure 1:
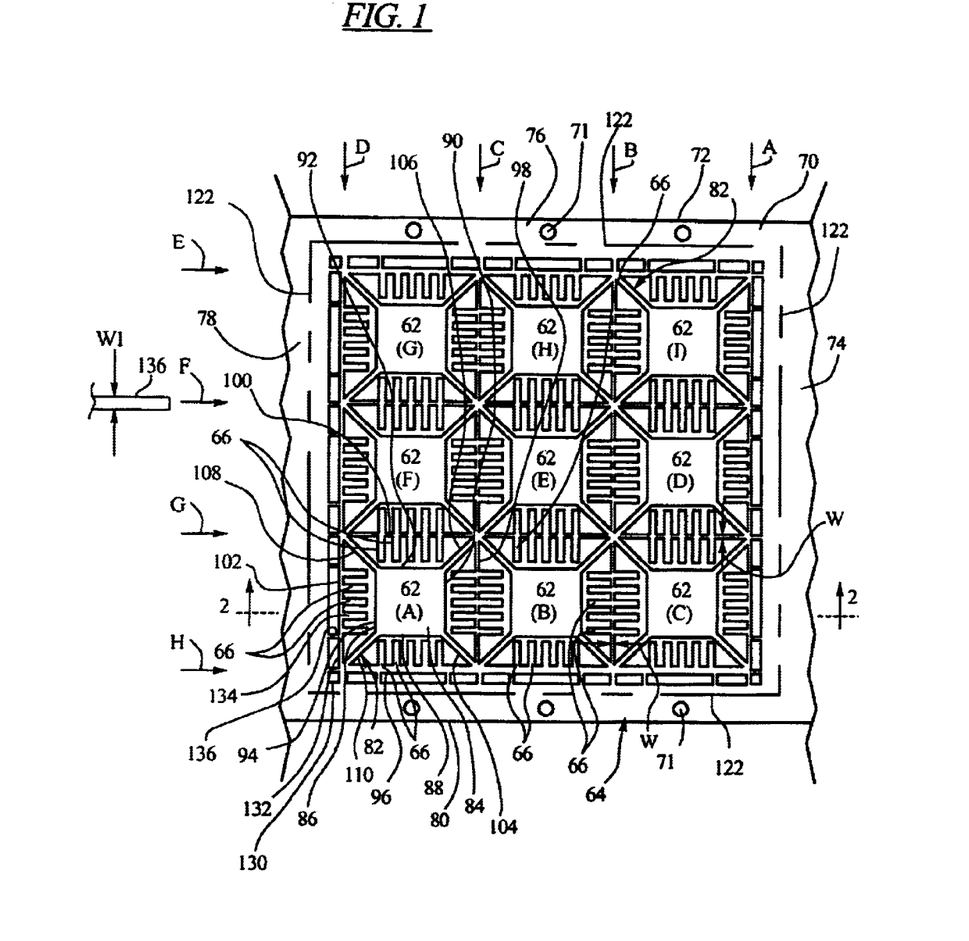
FIG. 1 is a fragmentary, plan view of one form of lead frame usable to make multiple semiconductor devices, and with a tie bar network with tie bars formed to reduce the thickness thereof, according to the present invention.
Figure 2:
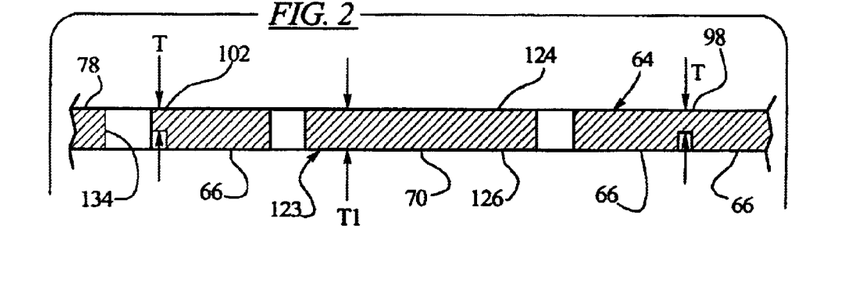
FIG. 2 is an enlarged, cross-sectional view of the lead frame taken along line 2—2 of FIG. 1.
Figure 3:
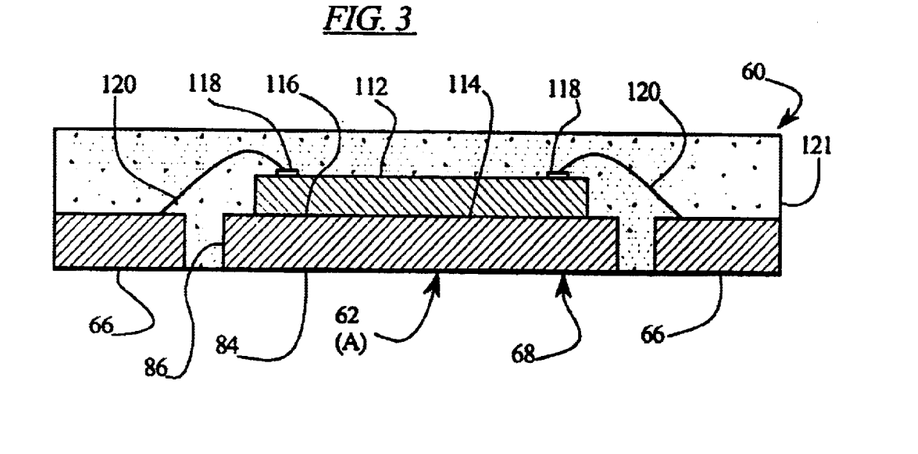
FIG. 3 is an enlarged, cross-sectional view of a semiconductor device incorporating a portion of the lead frame in FIGS. 1 and 2.
Figure 4:
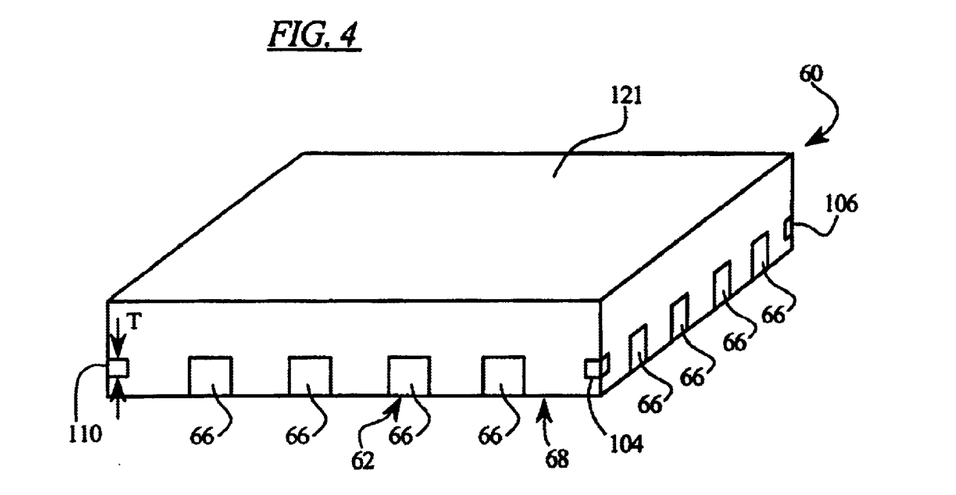
FIG. 4 is an enlarged, perspective view of the semiconductor device in FIG. 3.

The lead frame 64 is defined by a sheet 70, made of conductive material, and having drive openings 71. The sheet 70 has a base rail 72 consisting of four portions 74, 76, 78, 80 which cooperatively bound the matrix of nine (9) interconnected unit lead frames 62. The unit lead frames 62 are shown connected to each other and the base rail 72 through a tie bar network at 82 consisting of a series of elongate tie bars.

The exemplary unit lead frame 62 at A has a support 84 which has a rectangular outer edge 86 defined by straight, outer edge portions 88, 90, 92, 94.

The tie bar network 82 includes four, straight, peripheral, elongate tie bars 96, 98, 100, 102 which extend around the support 84 with the tie bars 96, 98, 100, 102 being spaced from, and substantially parallel to, the outer edge portions 88, 90, 92, 94 consecutively.

The tie bar network 82 further includes four support tie bar assemblies, in this embodiment consisting of individual support tie bars 104, 106, 108, 110 which extend between the corner of the support and a corner defined at the juncture between adjacent, and orthogonal, peripheral tie bars 96, 98, 100, 102. These peripheral tie bars 96, 98, 100, 102 are shared between either adjacent unit lead frames 62 or a unit lead frame 62 and a part of the base rail 72 throughout the lead frame 64.

The peripheral tie bars 96, 98, 100, 102 also each support a plurality of leads 66, and in this case four such leads 66 outside of each outer edge portion 88, 90, 92, 94 of the support 84. The tie bar network 82 thus maintains the supports 84 and leads 66 in a desired operative relationship and also interconnects the matrix of unit lead frames 62 and connects the unit lead frames 62 with the base rail 72.

The sheet 70 can be cut, etched, stamped, or otherwise processed to produce the lead frame configuration shown. The sheet 70 can be made from a thin sheet of copper, or other conductive material. In this embodiment, the various tie bars 96–110 have a substantially uniform width W.

Figure 9:
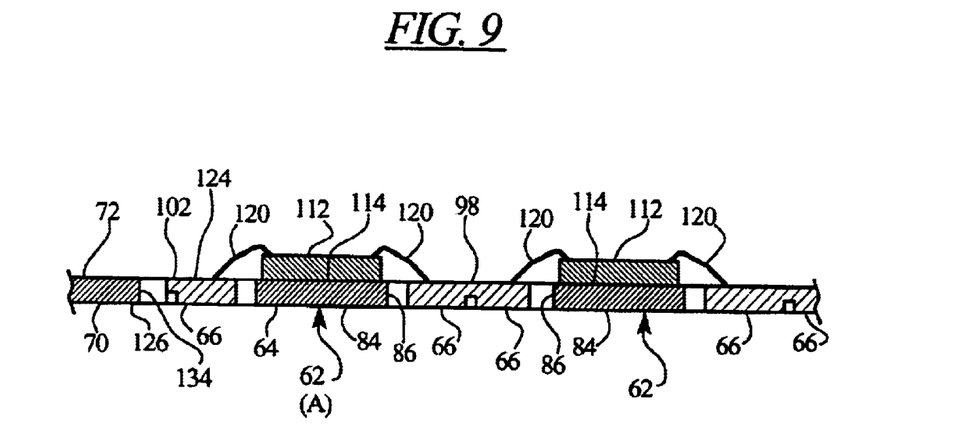
FIG. 9 is an enlarged, fragmentary, cross-sectional view of the lead frame of FIGS. 5–8 with semiconductor chips mounted thereon and electrically connected to leads on the lead frame.

Once the lead frame 64 is formed, semiconductor chips 112 are adhered to a surface 114 of each support 84. Bonding may be effected using an adhesive 116, that may be, for example, silver paste, or other type of adhesive, or an adhesive tape.

Figure 10:
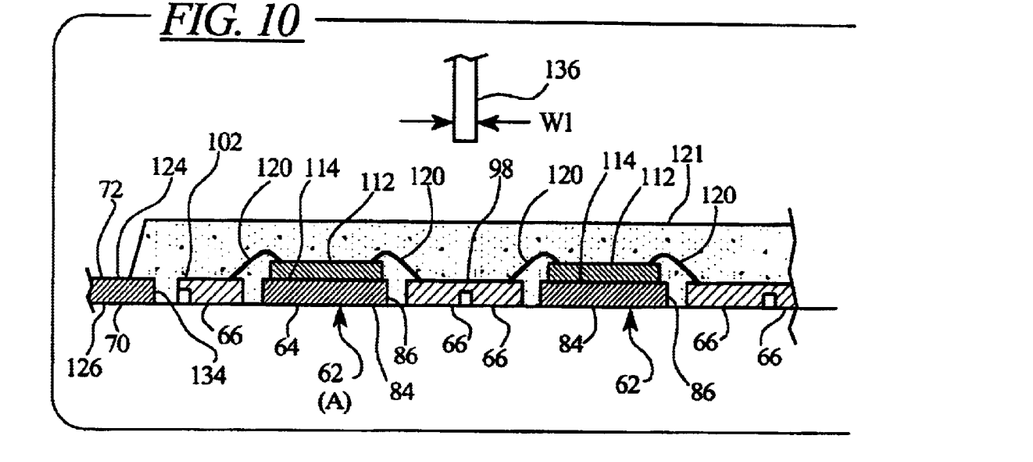
FIG. 10 is a view as in FIG. 9 with a resin layer applied over the semiconductor chips on one side of the lead frame and showing the manner of cutting the resulting semiconductor assembly to produce individual semiconductor chips.
Figure 11:
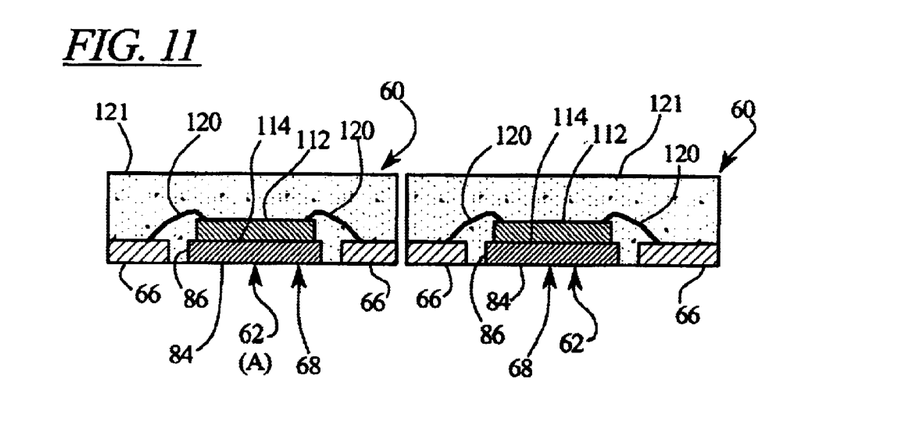
FIG. 11 is a view as in FIG. 10 with the semiconductor assembly cut through to define individual semiconductor devices.

Electrodes 118 on the semiconductor chips 112 are electrically connected to the leads 66 through conductive elements, which in this case are wire leads 120. Resin 121 is then poured over the entire matrix of lead frames 62 within the square border identified by the line 122. Once cured, the resin 121 effects sealing and fixing of the semiconductor components. The resin 121 may be an epoxy or another type of resin known to those skilled in this art.

According to the invention, at least a portion of the tie bar network 82 is treated/processed to produce a localized thickness T that is less than the thickness T1 between oppositely facing surfaces 124, 126 of the sheet 70. The localized "thinning" facilitates cutting of the individual semiconductor devices 60 from a semiconductor assembly consisting of the lead frame 64 with the applied semiconductor chips 40, wire leads 120, and resin 121.

Figure 5:
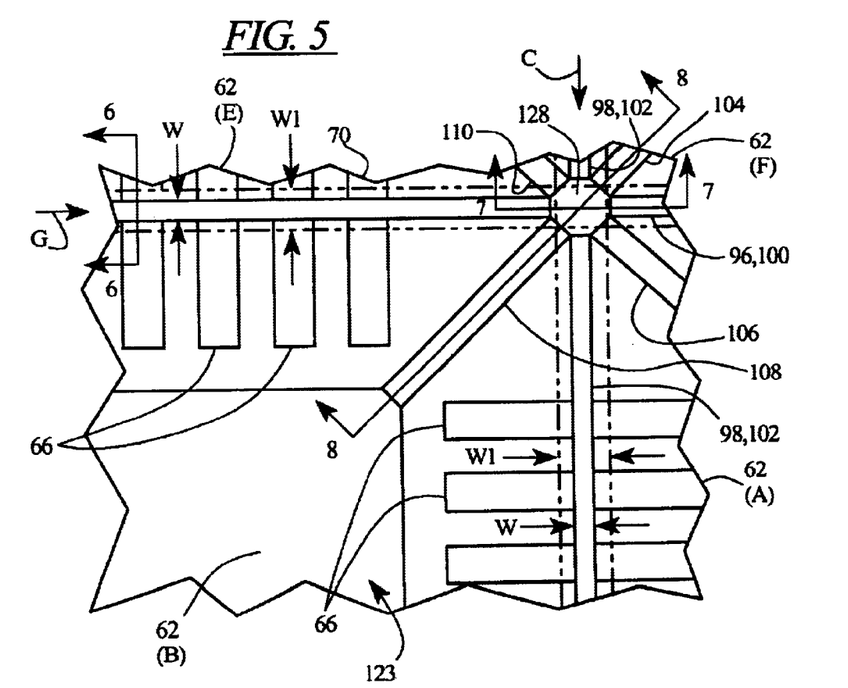
FIG. 5 is a fragmentary, bottom view of a modified form of lead frame, according to the present invention, and including a tie bar network with tie bars formed to reduce the thickness thereof.
Figure 6:
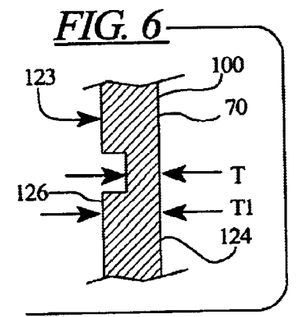
FIG. 6 is an enlarged, cross-sectional view of one of the tie bars on the tie bar network taken along line 6—6 of FIG. 5.
Figure 7:
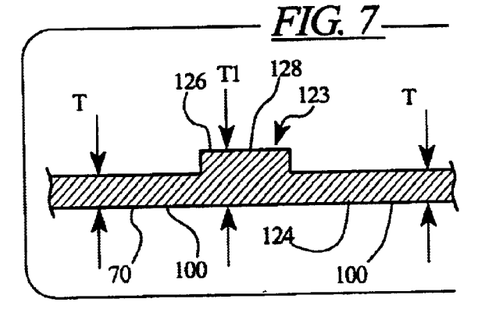
FIG. 7 is an enlarged, cross-sectional view of one of the tie bars on the tie bar network taken along line 7—7 of FIG. 5.
Figure 8:
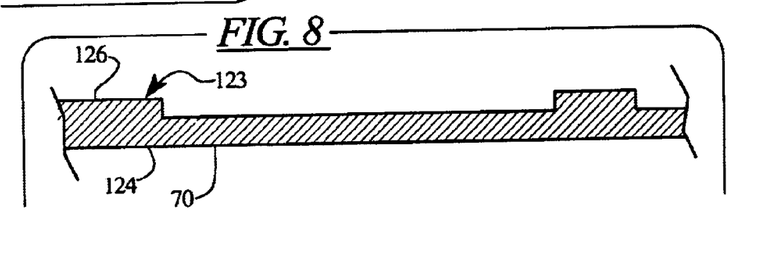
FIG. 8 is an enlarged, cross-sectional view of one of the tie bars on the tie bar network taken along line 8—8 of FIG. 5.

Referring additionally to FIGS. 5–8, in conjunction with FIGS. 1–4 and 9–11, the back side 123 of the sheet 70 is treated to reduce the thickness thereof. This treatment may involve an etching process or compression of the sheet material, as through the use of a press. In FIGS. 5 and 6, the peripheral tie bar 100 is shown treated to be reduced in thickness to the dimension T. As shown in FIGS. 5 and 7, the peripheral tie bars 100 on adjacent unit lead frames 62 at A and B are treated to be reduced to the thickness T on opposite sides of a polygonal corner portion 128, at which the four support tie bars 104, 106, 108, 110 and shared peripheral tie bars 96, 98, 100, 102 from four adjacent lead frames 62 meet.

Where the peripheral tie bars 96, 102, on the unit lead frame 62 at A connect to the base rail 72, the base rail portion 76 has a series of squared cut outs 130, 132, 134 of different lengths, with a common width. The cut outs 130, 132, 134 define coupling tie bars 136 between the peripheral tie bars 96, 102 and the base rail portions 80, 78, respectively. At the base rail portion 78, exemplary peripheral tie bar 102 is treated, by the aforementioned etching or pressing processes, previously described, or otherwise, to reduce the thickness thereof to the dimension T. The peripheral tie bar 96 is similarly processed to reduce its effective thickness.

Once the lead frame assembly, consisting of the lead frame 64 with the semiconductor chips 112, wire leads 120, and resin 121 operatively connected thereto is completed, the individual semiconductor devices 60 are separated from each other and the base rail 72 through a cutting operation using a cutting blade 136 (FIGS. 1 and 10) having a width W1 that is slightly greater than the width W of the tie bars 96 through 110. Other types of cutting devices can be used to effect the separation of the semiconductor devices 60. Cutting is carried out along dividing lines coincident with the length of the peripheral tie bars 96 through 102 in orthogonal directions, as indicated by the arrows A–H in FIGS. 1 and 5. The cutting width W1 is identified by the dotted lines in FIG. 5. This cutting pattern also removes a portion of the support tie bars 104, 106, 108, 110 as shown at 138 in FIG. 5.

The treatment of the tie bars 96–110 may be carried out in the same process during which the lead frame 64 is formed, or in a separate process. While the process is shown performed on one side of the sheet 70, the process can be carried out on either side of the sheet, or on both sides of the sheet, to effectively thin the tie bars 96–110.

By reason of reducing the effective thickness of the tie bars 96–110, the cutting resistance from the tie bars 96–110 is reduced and made closer to that of the resin layer 121. This more uniform cutting resistance tends to reduce peeling of the resin 121 from the sheet 70 during the cutting operation that separates the semiconductor devices 60. As a result, precise and consistent formation of high quality semiconductor device 60 is made possible.

Figure 12:
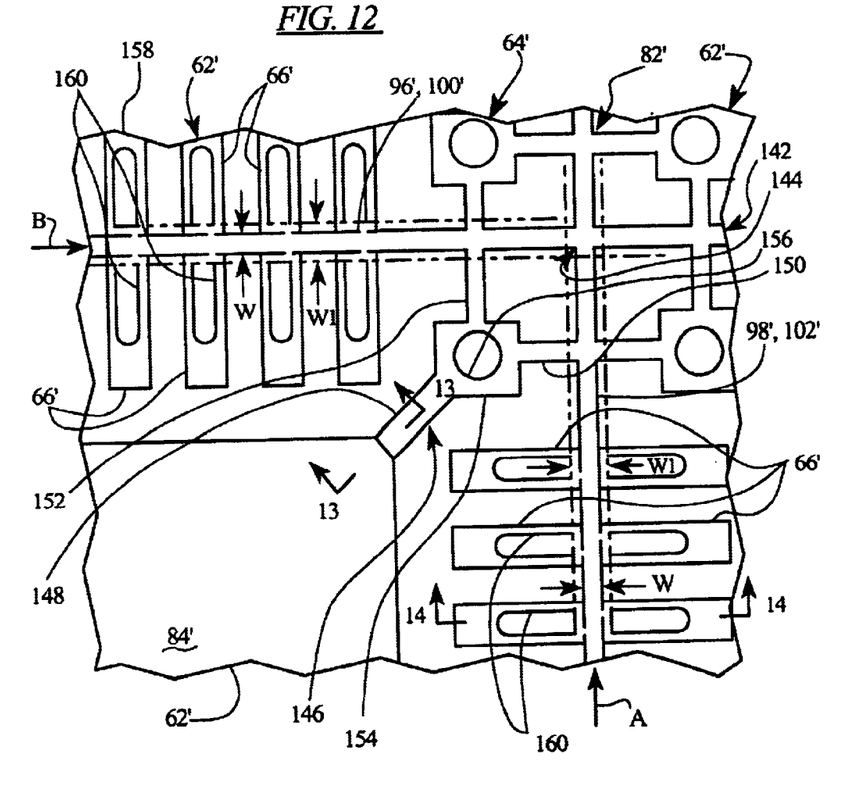
FIG. 12 is a view as in FIG. 5 of a still further modified form of lead frame, according to the present invention, with a tie bar network including tie bars formed to reduce the thickness thereof.
Figure 13:
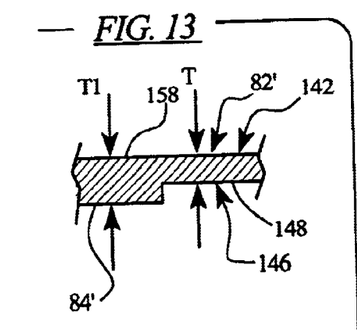
FIG. 13 is an enlarged, cross-sectional view of one of the tie bars on the tie bar network taken along line 13—13 of FIG. 12.
Figure 14:
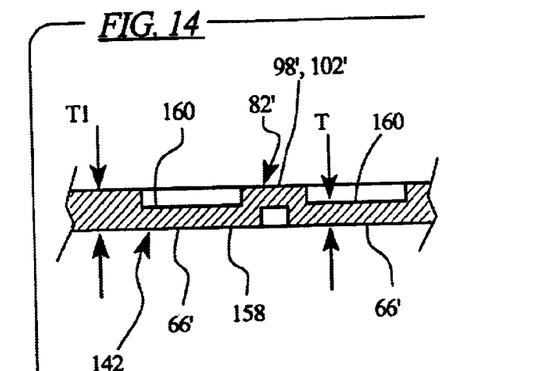
FIG. 14 is an enlarged, cross-sectional view of one of the tie bars on the tie bar network taken along line 14—14 of FIG. 12.
Figure 15:
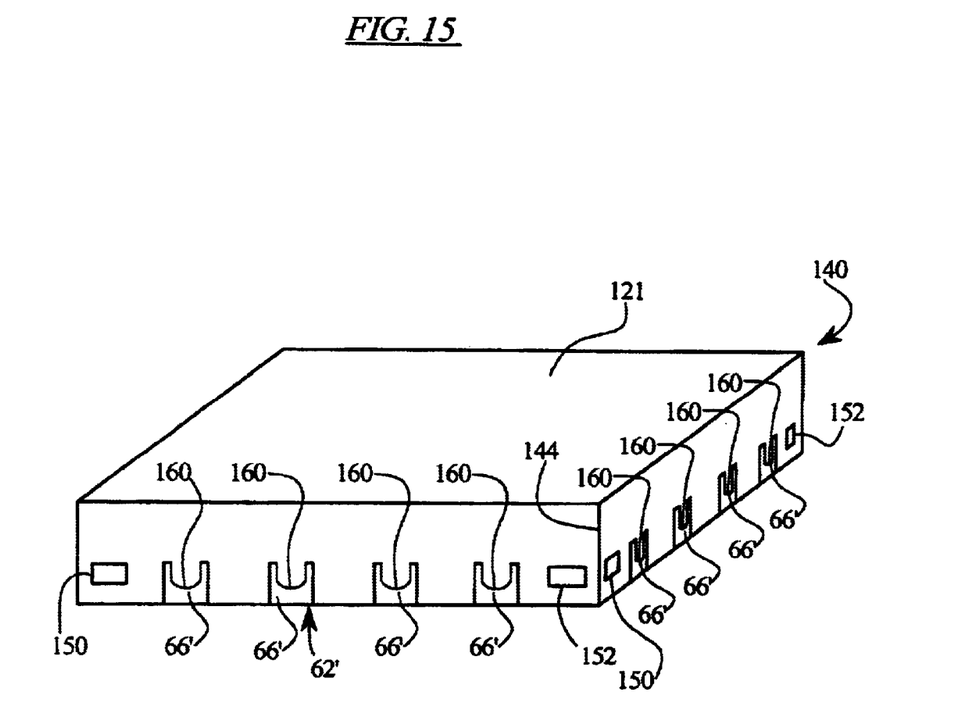
FIG. 15 is a perspective view of a semiconductor chip made using the lead frame in FIGS. 12–14.

Another form of the semiconductor device, made according to the present invention, is shown at 140 in FIG. 15, using the MAP process with a lead frame 142, as shown in FIGS. 12–14. The lead frame 142 consists of a plurality of joined, unit lead frames 62', each consisting of a support 84' and leads 66' spaced around the support 84'. The supports 84' and leads 66' are maintained in operative relationship by a tie bar network 82', which also interconnects the unit lead frames 62' to each other and to a base rail (not shown) corresponding to the base rail 72.

The lead frame 64' differs from the lead frame 64 primarily in two areas. First, each support 84' is connected to peripheral tie bars 96', 98', 100', 102', as shown at a corner 144 defined at the juncture of exemplary tie bars 98', 100' in FIG. 12, by a modified form of support tie bar assembly at 146. The support tie bar assembly 146 consists of a tie bar 148 that projects away from the support 84' at a corner thereof, and branches in a Y-shape to define tie bars 150, 152 which join to the peripheral tie bars 98', 100' at locations spaced from the corner 144.

Where the tie bar assembly 144 branches, there is an enlargement 154, in this case in the shape of a squared element, with an opening 156 therethrough. The sheet 158, from which the lead frame 142 is formed, is processed, as previously described, i.e. by etching, compression, or otherwise, to strategically thin portions of the tie bar network 82'. The peripheral tie bars 96', 98', 100', 102', are treated so that they are "thinned" continuously around the periphery of each support 84'. The support tie bar assemblies 146 can likewise be thinned, as shown in FIG. 13, so as to have a thickness T less than the thickness T1 of the supports 84' and other parts of the sheet 158.

The second difference in the lead frame 142 is at the leads 66'. Each lead 66' is formed with an undercut 160 along a substantial length thereof. The undercut extends to approximately ½ the thickness T1 of the sheet 158.

The thinning of the sheet 158 and formation of the undercuts 160 may be carried out at the same time as the lead frame 64' is formed or may be carried out in a separate operation. The number of enlargements 154, the shape thereof, and number and shape of openings 156 may be varied considerably from that shown.

The peripheral tie bars 96', 98', 100', 102' have a width W that is less than the width W1 of the cutting blade 136 (FIGS. 1 and 10) used to effect separation of the individual semiconductor devices 140.

With this configuration, when the resin 121 is applied, it migrates into the undercuts 160 and through the openings 156 to effect a positive bond between the resin 121 and the lead frame 64'. A positive bond resists peeling of the resin 121 from the lead frame 64', particularly during the cutting operation during which the individual semiconductor devices 140 are separated from each other.

By reason of the branching of the tie bar assembly 146, the tie bar assembly 146 is not required to project at the corners 144. This avoids burr formation that is common directly at the corners 144 caused by the cutting blade 136. If no burrs are formed, a separate deburring operation is obviated.

The branching of the tie bar assembly 146, the undercutting of the leads 66' and the use of openings 156 each potentially provide an advantage on their own and need not all be incorporated into any design.

The "thinning" affords the advantages previously described. As shown in FIG. 12, the cutting blade 136 cuts a width W1 along dividing lines A, B along the length of each of the peripheral tie bars 96', 98', 100', 102'. The width W1 is greater than the width W.

In the embodiment shown, the undercuts 160 do not extend into the cutting path of the cutting blade 136. However, so long as the path of the cutting blade 136 is generally symmetrical about a dividing line at the center of the peripheral tie bars 96', 98', 100', 102', desired cutting characteristics can be achieved. The thinning affords all of the advantages described with respect to the prior embodiment, i.e. promotes precise, stable cutting operations, which facilitates manufacture of high quality semiconductor devices with consistent shape and good adherence between the unit lead frames 62' and the resin 121.

Figure 18:
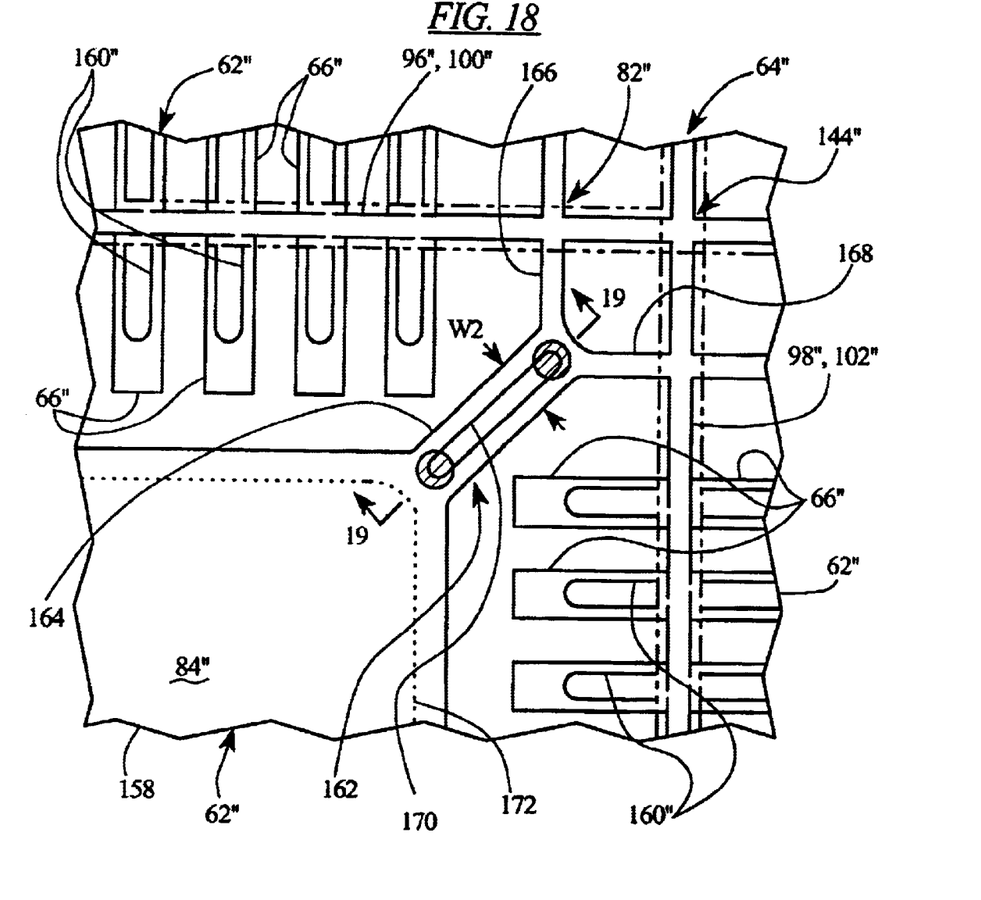
FIG. 18 is a view as in FIG. 12 of a still further modified form of lead frame, according to the present invention, with a tie bar network including tie bars formed to reduce the thickness thereof.
Figure 19:
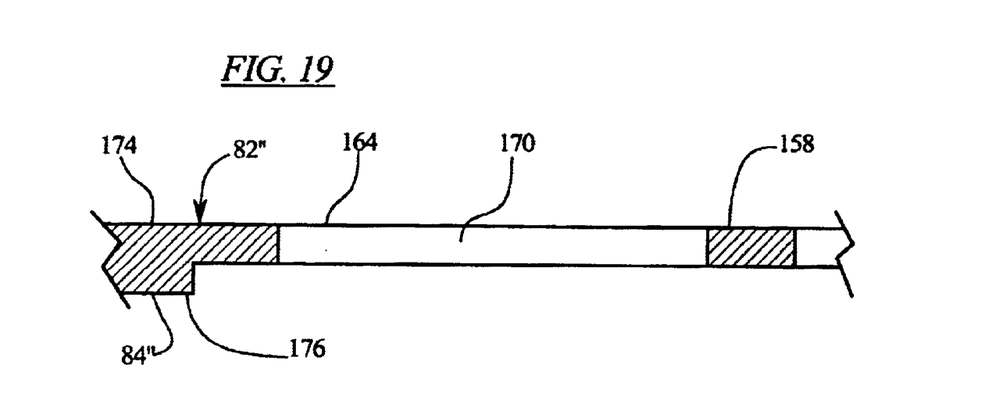
FIG. 19 is an enlarged, cross-sectional view of a tie bar taken along line 19—19 of FIG. 18.

In FIGS. 18 and 19, a further modified form of lead frame, according to the present invention, is shown at 64". The lead frame 64" has a construction similar to the lead frame 64', previously described. That is, individual supports 84" are maintained in operative relationship with leads 66" by a tie bar network 82", which also connects individual unit lead frames 62" to each other and to a base rail (not shown) corresponding to the base rail 72, previously described.

The primary difference in the embodiment in FIGS. 18 and 19 is in the configuration of the support tie bar assembly 162, corresponding to the support tie bar assembly 146, previously described.

The support tie bar assembly 162 has a tie bar 164 extending away from the support 84", towards a corner 144" at the juncture of peripheral tie bars 96", 98", 100", 102". The support tie bar assembly 162 branches to define a Y shape with tie bars 166, 168 joining the peripheral tie bars 96", 98", 100", 102" at locations spaced from the corner 144".

The tie bar 164 has an elongate opening 170 formed therethrough. The opening 170 extends over a substantial length of the tie bar 164, and preferably over substantially the entire length thereof from the support 84" substantially to the location at which the support tie bar assembly 162 branches. Resin 121 (not shown in FIGS. 18 and 19) applied to the lead frame 64" migrates into the opening 170 to enhance the adherence between the resin 121 and lead frame 64", to thereby resist peeling of the resin 121. The closer the elongate opening 170 extends to the corner 144", the greater is the peeling resistance thereat.

Preferably, the elongate opening 170 does not extend into the support sufficiently to overlap the footprint for the semiconductor chip (not shown) mounted thereon, as indicated by the line 172. Otherwise, the adhesive used to bond the semiconductor chip may migrate into the opening 170.

The "thinning" can be carried out at the time of forming the lead frame 64" or in a separate operation. The thinning may be performed in the same manner as for the lead frame 64', i.e. along the full peripheral extent of the peripheral tie bars 96", 98", 100", 102". Additionally, the support tie bar assembly 162 is thinned.

All thinning is carried out as previously described, i.e. by etching, pressing, or otherwise. As in all embodiments, the thinning can take place on either or both of the oppositely facing sides, 174, 176, of the sheet 158.

The elongate shape of the opening 170 is preferred in that individual round openings would not have a sufficient diameter based on the width W2 of the tie bar 164 to significantly increase the adherence between the resin 121 and the lead frame 64". A series of round openings could be used or an elongate single opening of a different shape could be employed to accomplish the same result. In all embodiments, it is desirable to have a significant migration of the resin 121 into any openings for bonding enhancement.

The leads 66" are also shown to have undercuts 160", corresponding to the undercuts 160, previously described. The undercuts 160" accept resin to again enhance bonding between the resin 121 and the lead frame 64".

The branching of the support tie bar assembly 162 affords the same advantages described with respect to the tie bar assembly 146 i.e. avoids burr formation by exposing the tie bar portions 166,168 at a flat external surface, rather than at a corner.

With the thinning carried out as previously described, cutting is facilitated potentially minimizing peeling of the resin 121.

Figure 16:
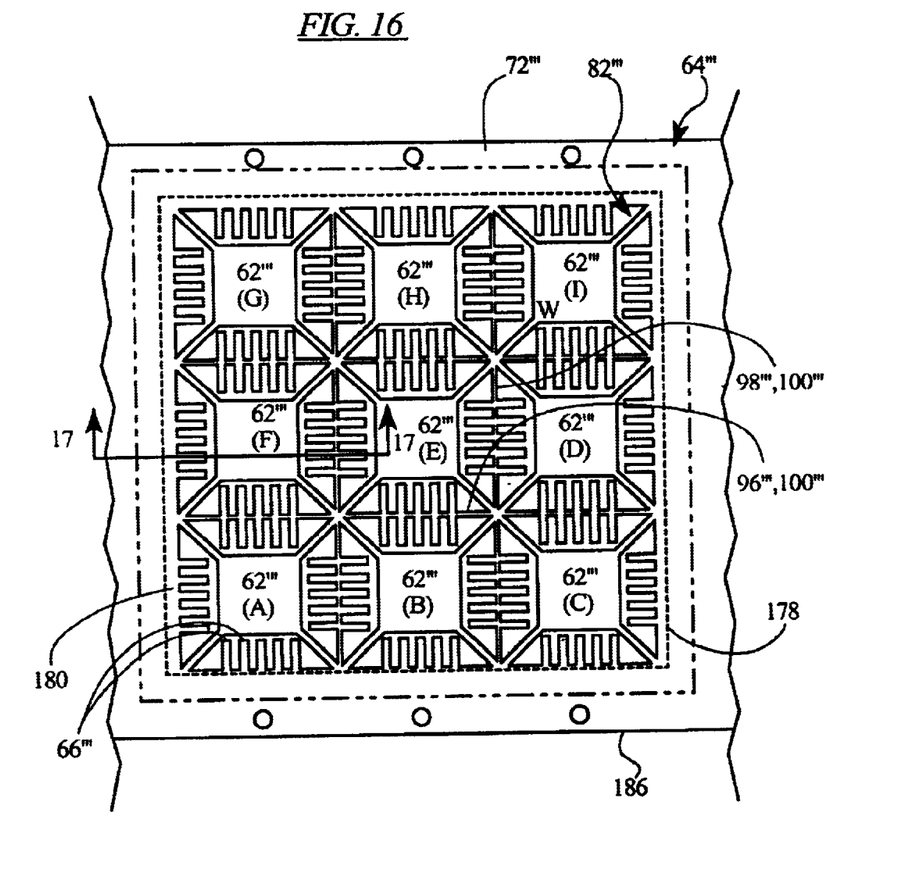
FIG. 16 is a plan view of a further modified form of lead frame, made according to the present invention, and with reduced thickness portions where individual unit lead frames connect to a peripheral base rail.
Figure 17:
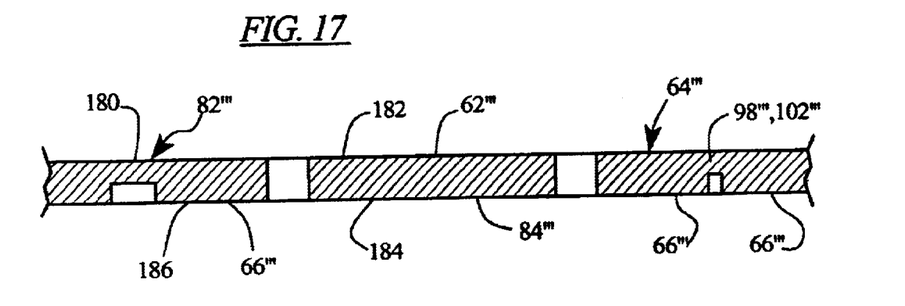
FIG. 17 is an enlarged, cross-sectional view of the lead frame taken along lines 17—17 of FIG. 16.

A further modified form of lead frame, according to the present invention, is shown at 64''' in FIGS. 16 and 17. The lead frame 64''' has a matrix of square unit lead frames 62''' (A–I) surrounded by a base rail 72'''. The lead frame 64''' differs from the lead frame 64 shown in FIG. 1 in that there are no cut outs corresponding to the cut outs 130, 132, 134, as previously described, in the base rail 72'''. Accordingly, the base rail 72''' is solid around the unit lead frames 62 so that there is no discernable narrow width tie bar at the interface between the base rail 72''' and the eight abutting unit lead frames 62''' (A–D and F–I).

In this embodiment, the base rail 72''' is thinned in the region shown bounded by the dotted frame 178, whereby a continuous, thinned tie bar 180 is formed continuously around the matrix of unit lead frames 62'''. This thinning can be carried out through the processes previously described. As in all embodiments, the thinning can be carried out on either or both of the oppositely facing sides 182, 184 of the sheet 186.

The advantages in terms of promoting cutting without variable resistance are realized with this embodiment in the same manner as for those previously described. The construction of the lead frame 64" otherwise is substantially the same as those constructions previously described, i.e. with a tie bar network 82''' including thinned peripheral tie bars 96''', 98''', 100''', 102''' surrounding supports 84''' and maintaining leads 66''' in operative relationship thereto.

Figure 20:
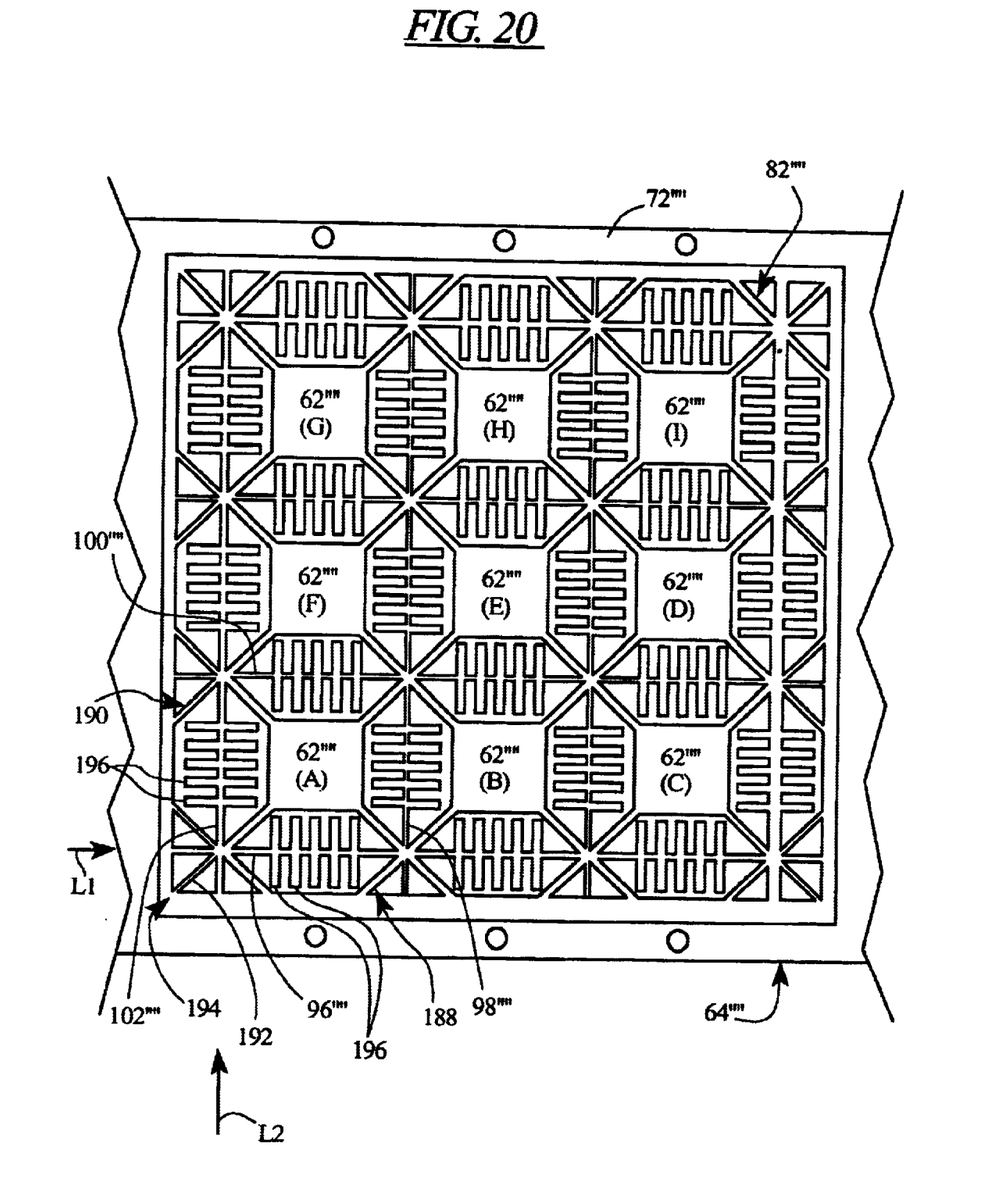
FIG. 20 is a fragmentary, plan view of a further modified form of lead frame, according to the present invention, wherein the tie bar network is extended where unit lead frames connect to a surrounding base rail.

A further modified form of lead frame, according to the present invention, is shown at 64'''' in FIG. 20. The lead frame 64'''' has a matrix of individual unit lead frames 62'''' (A–I), as described in the prior embodiments. The lead frames 64"41 differ from those in the previously described embodiments in the manner of connection between the eight peripheral unit lead frames 62'''' (A–D and F–I) and base rail 72''''. The exemplary unit lead frame 62'''' at A has peripheral tie bars 96'''', 98'''', 100'''', 102'''' extending continuously therearound. In this embodiment, the tie bars 96'''', 102''' that connect to the base rail 72'''' define dividing lines L1, L2 where the lead frame 64'''' at A is cut to separate the unit lead frame 62'''' at A from the base rail 72''''. In this embodiment, the tie bar network 82'''' has an extension 188, 190 from each peripheral tie bar 96'''', 102''''. Each extension 188, 190 is symmetrical about its respective dividing line L1, L2. An additional tie bar 192 extends from a unit lead frame 62''' at A to the inside corner 194 of the base rail 72.

The peripheral tie bars 96'''', 98'''', 100'''', 102'''' are thinned, as is the tie bar 192, to facilitate cutting, as previously described. The leads 196 on the extensions 188, 190 need not be thinned.

While the extensions 188, 190 are shown to be exactly symmetrically around the dividing lines L1, L2, they need not be. Symmetry is preferably maintained sufficiently that the resistance to cuffing is substantially the same on both sides of the dividing lines L1, L2 so that precise cuffing without substantial variable resistance can be carried out to produce consistent, high quality semiconductor devices from the lead frame 64", which is incorporated therein.

The thinning can be carried out by any means known to those skilled in the art, including, but not limited to those described above. This is true for all embodiments.

While the electrical connections between the semiconductor chips and leads is shown through a wire connection method, the use of a flip chip connection is also contemplated.

The sheet material for the lead frames, while described as copper, could be any suitable conductive material, such as iron alloys, etc.

The foregoing disclosure of specific embodiments is intended to be illustrative of the broad concepts comprehended by the invention.

What is claimed is:

1. A lead frame for a semiconductor device, the lead frame comprising:
   a sheet having oppositely facing sides and a thickness between the oppositely facing sides,
   the sheet comprising first and second unit lead frames,
   each said unit lead frame comprising a support for a semiconductor chip and at least one lead spaced from the support,
   the sheet further comprising a tie bar network which connects a) the support to the at least one lead on each of the first and second unit lead frames and b) the first and second unit lead frames each to the other,
   the sheet having a dividing line along which the sheet can be cut to separate the first and second unit lead frames from each other,
   the tie bar network comprising at least one tie bar extending along a substantial length of the dividing line,
   the support having a first thickness between the oppositely facing sides of the sheet,
   the at least one tie bar having a second thickness between the oppositely facing sides of the sheet over a substantial length of the dividing line that is less than the first thickness,
   the at least one lead on at least one of the unit lead frames having a length, a width, and a thickness,
   the at least one lead on the at least one unit lead frame having an undercut extending along a substantial length of the at least one lead on the at least one unit lead frame.

2. The lead frame for a semiconductor device according to claim 1 wherein the support on the first unit lead frame has a polygonal shape with an outer edge defined by a plurality of straight edge portions, the dividing line is substantially straight and has a length and is spaced from and extends substantially parallel to one of the straight edge portions, and the at least one tie bar has a thickness between the oppositely facing sides of the sheet that is less than the first thickness over substantially the entire length of the dividing line.

3. The lead frame for a semiconductor device according to claim 1 wherein the first unit lead frame has a corner, and the tie bar network comprises a support tie bar assembly comprising at least one support tie bar that extends from the support on the first unit lead frame towards the corner.

4. The lead frame for a semiconductor device according to claim 3 wherein the first unit lead frame has first and second peripheral tie bars that meet at the corner end the support tie bar assembly branches away from the support on the first unit lead frame to define a first support tie bar that extends to the first peripheral tie bar and a second support tie bar that extends to the second peripheral tie bar.

5. The lead frame for a semiconductor device according to claim 4 wherein the support tie bar assembly has a length and a thickness between the oppositely facing sides of the sheet that is less than the first thickness over at least a portion of the length of the support tie bar assembly.

6. The lead frame for a semiconductor device according to claim 5 wherein the support tie bar assembly extends to the corner at which the first and second peripheral tie bars meet and the sheet at the corner at which the first and second peripheral tie bars meet has a thickness that is less than the first thickness.

7. The lead frame for a semiconductor device according to claim 3 wherein the at least one support tie bar has a discrete opening therethrough.

8. The lead frame for a semiconductor device according to claim 7 wherein the discrete opening is fully surrounded by the at least one support tie bar.

9. The lead frame for a semiconductor device according to claim 8 wherein the discrete opening is an elongate opening.

10. The lead frame for a semiconductor device according to claim 1 wherein the undercut on the at least one lead on the at least one unit lead frame extends to approximately one half the thickness of the at least one lead on the at least one unit lead frame.

11. The lead frame for a semiconductor device according to claim 1 wherein said first and second unit lead frames each have a rectangular shape with a peripheral edge defined by first, second, third and fourth peripheral edge portions, the support on the first unit lead frame has a rectangular shape defined by first, second, third, and fourth outer edges, the first, second, third and fourth peripheral edge portions are substantially parallel to the first, second, third, and fourth outer edges and there are a plurality of leads between the first peripheral edge portion and the first outer edge, the second peripheral edge portion and the second outer edge, the third peripheral edge portion and the third outer edge, and the fourth peripheral edge portion and the fourth outer edge.

12. The lead frame for a semiconductor device according to claim 1 wherein the sheet comprises a border rail, the tie bar network connects the first unit lead frame to the border rail, and the first unit lead frame has a peripheral edge connected to the border rail through the tie bar network.

13. The lead frame for a semiconductor device according to claim 12 wherein the sheet has a second dividing line along the peripheral edge along which the sheet can be cut to separate the first unit lead frame from at least a part of the border rail, and the tie bar network comprises at least a second tie bar extending along a substantial length of the second dividing line, the at least second tie bar having a thickness between the oppositely facing sides of the sheet over a substantial length of the second dividing line that is less than the first thickness.

14. The lead frame for a semiconductor device according to claim 12 wherein the sheet has a second dividing line along the peripheral edge along which the sheet can be cut to separate the first unit lead frame from at least a part of the border rail, the support on the first unit lead frame is on a first side of the second dividing line and the at least part of the border rail is on a second side of the second dividing line, and the at least one lead on the first unit lead frame and the tie bar network are sufficiently symmetrical at the first and second sides of the second dividing line that resistance to cutting along the second dividing line at the first and second sides is substantially the same.

15. The lead frame for a semiconductor device according to claim 1 wherein at least one of the oppositely facing sides of the sheet is formed to produce the second thickness.

16. The lead frame for a semiconductor device according to claim 15 wherein at least one of the oppositely facing sides as formed by one of etching and compression.

17. The lead frame for a semiconductor device according to claim 15 wherein the sheet comprises a border rail, the first unit lead frame has a peripheral edge defined by a plurality of peripheral edge portions, the tie bar network and the at least one lead extends continuously around the first unit lead frame so as to connect the first unit lead frame to a) the second unit lead frame, b) the border rail and c) at least a third unit lead frame, and the tie bar network has at least a portion with a thickness less than the first thickness extending substantially fully around the peripheral edge of the first unit lead frame.

18. The lead frame for a semiconductor device according to claim 17 wherein the at least one lead has a portion with a thickness that is less than the first thickness.

19. The lead frame for a semiconductor device according to claim 18 wherein the tie bar network has a thickness less than the first thickness extending continuously fully around the first unit lead frame.

20. A semiconductor assembly comprising:
   a) a lead frame comprising:
      a sheet having oppositely facing sides and a thickness between the oppositely facing sides,
      the sheet comprising first and second unit lead frames, each said unit lead frame comprising a support for a semiconductor chip and at least one lead spaced from the support,
      the sheet further comprising a tie bar network which connects a) the support to the at least one lead on each of the first and second unit lead frames and b) the first and second unit lead frames each to the other,
      the sheet having a dividing line along which the sheet can be cut to separate the first and second unit lead frames from each other,
      the tie bar network comprising at least one tie bar extending along a substantial length of the dividing line,
      the support having a first thickness between the oppositely facing sides of the sheet,
      the at least one tie bar having a second thickness between the oppositely facing sides of the sheet over a substantial length of the dividing line that is less than the first thickness;
   b) a first semiconductor chip applied to the support on the first unit lead frame;
   c) a first conductive element electrically connecting the first semiconductor chip to the at least one lead on the first unit lead frame;
   d) a second semiconductor chip applied to the support on the second unit lead frame;
   e) a second conductive element electrically connecting the second semiconductor chip to the at least one lead on the second unit lead frame; and
   f) a resin layer applied over one of the oppositely facing sides of the sheet so as to be applied to the first and second semiconductor chips and the first and second conductive elements,
      the at least one lead on at least one of the unit lead frames having a length, a width, and a thickness,
      the at least one lead on the at least one of the unit lead frames having an undercut extending along a substantial length of the at least one lead on the at least one of the unit lead frames and the resin layer extends into the undercut.

21. The semiconductor assembly according to claim 20 wherein the support on the first unit lead frame has a polygonal shape with a peripheral edge defined by a plurality of straight edge portions, the dividing line is substantially straight and has a length and is spaced from and extends substantially parallel to one of the straight edge portions, and the at least one tie bar has a thickness between the oppositely facing sides of the sheet that is less than the first thickness over substantially the entire length of the dividing line.

22. The semiconductor assembly according to claim 20 wherein the first unit lead frame has a corner, and the tie bar network comprises a support tie bar assembly comprising at least one support tie bar that extends from the support on the first unit lead frame towards the corner.

23. The semiconductor assembly according to claim 22 wherein the first unit lead frame has first and second peripheral tie bars that meet at the corner and the support tie bar assembly branches away from the support on the first unit lead frame to define a first support tie bar that extends to the first tie bar and a second support tie bar that extends to the second peripheral tie bar.

24. The semiconductor assembly according to claim 23 wherein the support tie bar assembly has a length and a thickness between the oppositely facing sides of the sheet that is less than the first thickness over at least a portion of the length of the support tie bar assembly.

25. The semiconductor assembly according to claim 24 wherein the support tie bar assembly extends to the corner at which the first and second peripheral tie bars meet and the sheet at the corner at which the first and second peripheral tie bars meet has a thickness that is less than the first thickness.

26. The semiconductor assembly according to claim 22 wherein the at least one support tie bar has a discrete opening therethrough.

27. The semiconductor assembly according to claim 26 wherein the discrete opening is fully surrounded by the at least one support tie bar.

28. The semiconductor assembly according to claim 27 wherein the discrete opening is an elongate opening.

29. The semiconductor assembly according to claim 20 wherein the undercut in the at least one lead on the at least one of the unit lead frames extends to approximately one half the thickness of the at least one lead on the at least one of the unit lead frames.

30. The semiconductor assembly according to claim 20 wherein said first and second unit lead frames each have a rectangular shape with a peripheral edge defined by first, second, third and fourth peripheral edge portions, the support on the first unit lead frame has a rectangular shape defined by first, second, third, and fourth outer edges, the first, second, third and fourth peripheral edge portions are substantially parallel to the first, second, third, and fourth outer edges and there are a plurality of leads between the first peripheral edge portion and the first outer edge, the second peripheral edge portion and the second outer edge, the third peripheral edge portion and the third outer edge, and the fourth peripheral edge portion and the fourth outer edge.

31. The semiconductor assembly according to claim 20 wherein the sheet comprises a border rail, the tie bar network connects the at least first unit lead frame to the border rail, and the first unit lead frame has a peripheral edge portion connected to the border rail through the tie bar network.

32. The semiconductor assembly according to claim 31 wherein the sheet has a second dividing line along the peripheral edge along which the sheet can be cut to separate the first unit lead frame from at least a part of the border rail, and the tie bar network comprises at least a second tie bar extending along a substantial length of the second dividing line, the at least second tie bar having a thickness between the oppositely facing sides of the sheet over a substantial length of the second dividing line that is less than the first thickness.

33. The semiconductor assembly according to claim 31 wherein the sheet has a second dividing line along the peripheral edge along which the sheet can be cut to separate the first unit lead frame from at least a part of the border rail, the support on the first unit lead frame is on a first side of the second dividing line and the at least part of the border rail is on a second side of the second dividing line, and the at least one lead on the first unit lead frame and the tie bar network are sufficiently symmetrical at the first and second sides of the second dividing line that resistance to cutting along the second dividing line at the first and second sides is substantially the same.

34. The semiconductor assembly according to claim 20 wherein at least one of the oppositely facing sides of the sheet is formed to produce the second thickness.

35. The semiconductor assembly according to claim 34 wherein at least one of the oppositely facing sides is formed by one of etching and compression.

36. The semiconductor assembly according to claim 34 wherein the sheet comprises a border rail, the first unit lead frame has a peripheral edge defined by a plurality of peripheral edge portions, the tie bar network and the at least one lead extends continuously around the first unit lead frame so as to connect the first unit lead frame to a) the second unit lead frame, b) the border rail and c) at least a third unit lead frame, and the tie bar network has at least a portion with a thickness less than the first thickness extending substantially fully around the peripheral edge of the first unit lead frame.

37. The semiconductor assembly according to claim 36 wherein at least one lead has a portion with a thickness that is less than the first thickness.

38. The semiconductor assembly according to claim 37 wherein the tie bar network has a thickness less than the first thickness extending continuously fully around the first unit lead frame.

39. A method of forming a semiconductor device, said method comprising the steps of:
  A) providing a semiconductor assembly comprising:
    i) a lead frame comprising:
      a sheet having oppositely facing sides and a thickness between the oppositely facing sides,
      the sheet comprising first and second unit lead frames,
      each said unit lead frame comprising a support for a semiconductor chip and at least one lead spaced from the support,
      the at least one lead on at least one of the first and second unit lead frames having a length, a width, and a thickness and an undercut extending along a substantial length of the at least one lead on the at least one of the first and second unit lead frames,
      the sheet further comprising a tie bar network which connects a) the support to the at least one lead on each of the first and second unit lead frames and b) the first and second unit lead frames each to the other,
      the sheet having a dividing line along which the sheet can be cut to separate the first and second unit lead frames from each other,
      the tie bar network comprising at least one tie bar extending along a substantial length of the dividing line,
      the support having a first thickness between the oppositely facing sides of the sheet,
      the at least one tie bar having a second thickness between the oppositely facing sides of the sheet over a substantial length of the dividing line that is less than the first thickness;
    ii) a first semiconductor chip applied to the support on the first unit lead frame;
    iii) a first conductive element electrically connecting the first semiconductor chip to the at least one lead on the first unit lead frame;
    iv) a second semiconductor chip applied to the support on the second unit lead frame;
    v) a second conductive element electrically connecting the second semiconductor chip to the at least one lead on the second unit lead frame; and
    vi) a resin layer applied over one of the oppositely facing sides of the sheet so as to be applied to the first and second semiconductor chips and the first and second conductive elements; and
  B) forming a first semiconductor device by cutting through the resin layer and the lead frame around the first unit lead frame including along the dividing line.

40. The method of forming a semiconductor device according to claim 39 wherein the step of providing a semiconductor assembly comprises providing a semiconductor assembly wherein the undercut in the at least one lead on the at least one of the first and second unit lead frames extends to approximately one half the thickness of the at least one lead on the at least one of the first and second unit lead frames.

41. A semiconductor device comprising:
  a sheet portion defining a unit lead frame with oppositely facing sides and a thickness between the oppositely facing sides of the sheet portion,
  the unit lead frame comprising a support having a first thickness between the oppositely facing sides of the sheet portion,
  the unit lead frame further comprising at least one lead and a tie bar network comprising a plurality of elongate tie bars each with a length,
  the at least one lead having a length, a width, and a thickness and an undercut extending along a substantial length of the at least one lead,
  the tie bar network connecting the support to the at least one lead;
  a semiconductor chip on the support;
  a conductive element electrically connecting the semiconductor chip to the at least one lead; and
  a resin layer applied over the semiconductor chip, the conductive element and at least a part of one of the oppositely facing sides of the sheet portion,
  the semiconductor device having a peripheral edge comprising a plurality of straight edge portions defining a polygonal shape,
  a plurality of the peripheral edge portions formed by cutting to expose a part of the tie bar network,
  a first plurality of the elongate tie bars each having a substantial length that has a thickness between the oppositely facing sides of the sheet that is less than the first thickness.

42. The semiconductor device according to claim 41 wherein the undercut in the at least one lead extends to approximately one half the thickness of the at least one lead.

43. The semiconductor device according to claim 41 wherein the width of the at least one lead is bounded by side edges and the undercut resides fully within, and is spaced from, the side edges.

* * * * *